(12) United States Patent
Gurumurthy et al.

(10) Patent No.: US 8,578,224 B2
(45) Date of Patent: Nov. 5, 2013

(54) HIGH DENSITY FLIP-FLOP WITH ASYNCHRONOUS RESET

(75) Inventors: Girishankar Gurumurthy, Bangalore (IN); Mahesh Ramdas Vasishta, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 193 days.

(21) Appl. No.: 13/342,030

(22) Filed: Dec. 31, 2011
(Under 37 CFR 1.47)

(65) Prior Publication Data
US 2013/0173977 A1 Jul. 4, 2013

(51) Int. Cl.
*G01R 31/28* (2006.01)
(52) U.S. Cl.
USPC .......................................................... 714/726
(58) Field of Classification Search
USPC .................................. 714/724, 726, 729, 731
See application file for complete search history.

(56) References Cited

U.S. PATENT DOCUMENTS

| 7,013,415 B1 * | 3/2006 | Kamei et al. | 714/729 |
| 7,650,549 B2 * | 1/2010 | Branch et al. | 714/731 |
| 2008/0244342 A1 * | 10/2008 | Cooke | 714/726 |

* cited by examiner

*Primary Examiner* — Shelly A Chase
(74) *Attorney, Agent, or Firm* — John R. Pessetto; W. James Brady; Frederick J. Telecky, Jr.

(57) ABSTRACT

A master/slave latch includes an input stage, a master latch, a slave latch, and receives an asynchronous clear signal. The input stage is arranged to alternately pass or block a data input signal in response to a clock signal and a gated clock signal. The gated clock signal is the inverse of the clock signal when the asynchronous clear signal is not asserted, and the gated clock signal is not active when the asynchronous clear signal is asserted. The master latch receives and latches the passed data signal in a latched state, clears the latched state in response to the asynchronous clear signal being asserted, and generates a master latch output signal. The slave latch receives and latches the master latch output signal in a latched state. The cleared latched state is passed to the slave latch in response to the asynchronous clear signal being asserted.

20 Claims, 4 Drawing Sheets

HIGH DENSITY FLIP-FLOP WITH ASYNCHRONOUS RESET

BACKGROUND

Scan flip-flops are commonly used in a wide variety of circuits including application specific integrated circuits (ASIC), digital signal processors (DSP), and microprocessors, for example. In very large scale integration (VLSI) circuits, (e.g., on the scale of billions of transistors) typical designs include a significant portion of scan flip-flops (e.g., scan registers, scan master/slave latches) for test and verification. However, scan flip-flops are among the largest cells (as compared to other flip-flops, for example) because the functionality requires a larger number of transistors. Scan flip-flops require a larger surface area of the silicon due to the larger number of transistors required in a scan flip-flop, and often results in routing congestion in dense portions of instantiated scan flip-flops. Furthermore, the gates of a significant portion of the transistors in a scan flip-flop are coupled to a clock signal. Scan flip-flops normally consume more power, due to the large number of gates in a scan flip-flop that are coupled to the clock.

Scan flip-flops with asynchronous reset require even more transistors than a non-resettable scan flip-flop. As process technology rules trend toward more aggressive design rules at each successively smaller technology steps (e.g., routing in polysilicon layers drawn using 28 nm or 20 nm technologies), it is increasingly more difficult to layout the scan flip-flops because of the considerable size and power penalties of using resettable scan flip-flops.

SUMMARY

The problems noted above are solved in large by using a gated clock signal to clear a master/slave latch of a resettable scan flip-flop when an asynchronous clear signal is asserted. Using a gated clock signal to clear the master/slave latch with an asynchronous clear reduces the size of layout implementations because the "clear" logic is removed from the slave latch and added to the clock logic. Because the slave latch portion of the layout is more congested, moving the clear logic out of the slave latch portion reduces routing congestion, which thus reduces the area required for routing of and through the slave latch portion. Furthermore, power savings are achieved because the number of transistors switching during reset assertion is reduced, which consumes less power.

As disclosed herein, a master/slave latch includes an input stage, a master latch, a slave latch, and "clear" logic that is activated in response to an asynchronous clear signal. The input stage is arranged to alternately pass or block a data input signal in response to a clock signal and a gated clock signal. The gated clock signal is the inverse of the clock signal when the asynchronous clear signal is not asserted, and the gated clock signal is not active (e.g., low) when the asynchronous clear signal is asserted. The master latch receives and latches the passed data signal in a latched state, clears the latched state in response to the asynchronous clear signal being asserted, and generates a master latch output signal at a pass gate.

The slave latch receives and latches the master latch output signal in a latched state. The pass gate is arranged to pass the cleared latched gate to the slave latch in response to the asynchronous clear signal being asserted. Thus, for example, only the master latch includes reset transistors. The slave latch is reset through the master latch. The reset transistors are moved from congested slave latch area of the layout to the clock logic portion of the layout. The decreased congestion in the slave latch area provides size reduction. Furthermore, the transistors coupled to the gated clock do not toggle during reset, reducing power consumption.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms throughout the following description and claims are used to refer to particular system components. As one skilled in the art will appreciate, various names can be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . ." Also, the terms "coupled to" or "couples with" (and the like) are intended to describe either an indirect or direct electrical connection. Thus, if a first device couples to a second device, that connection can be through a direct electrical connection, or through an indirect electrical connection via other devices and connections. Further, the term "high" is generally intended to describe a signal that is at logic state "1," and the term "low" is generally intended to describe a signal that is at logic state "0." The term "on" applied to a transistor or group of transistors is generally intended to describe gate biasing to enable current flow through the transistor or transistors. The term "off" applied to a transistor or group of transistors is generally intended to describe gate biasing to disable current flow through the transistor or transistors.

Figure 1:
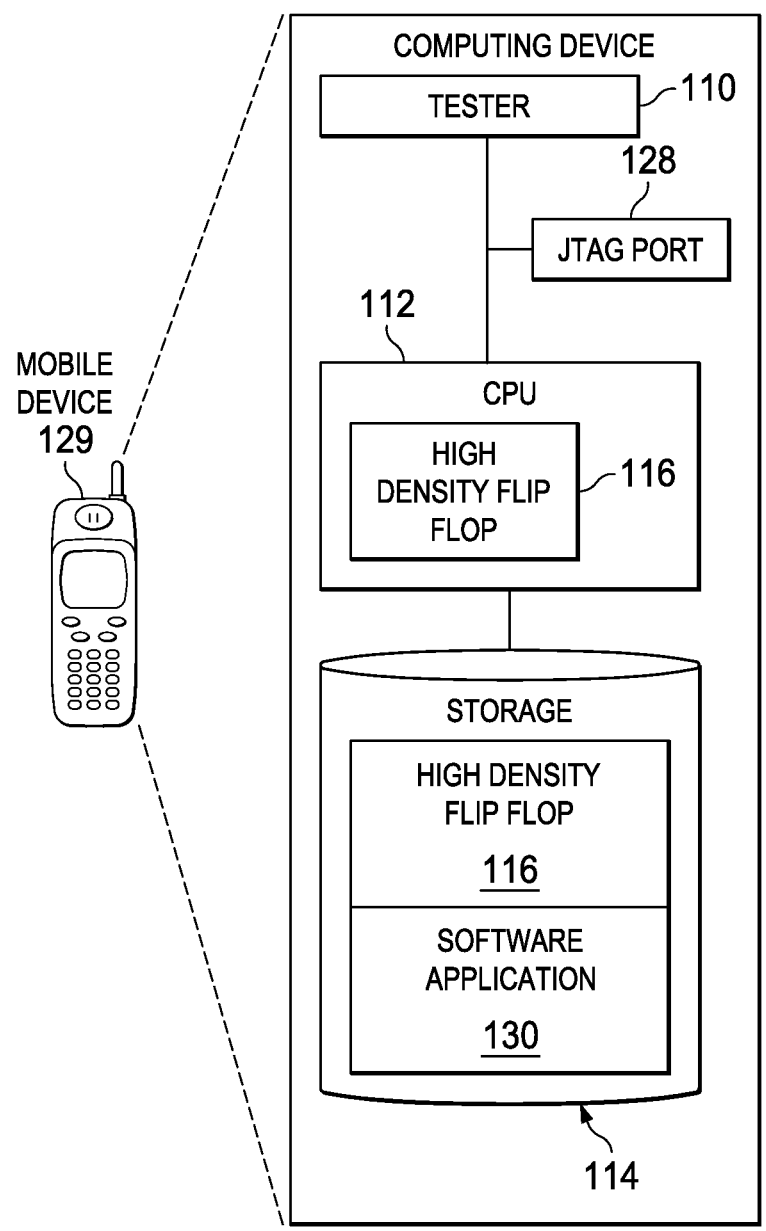
FIG. 1 shows an illustrative computing device 100 in accordance with embodiments of the disclosure.

FIG. 1 shows an illustrative computing device 100 in accordance with embodiments of the disclosure. The computing device 100 is, or is incorporated into, a mobile communication device 129, such as a mobile phone, a personal digital assistant (e.g., a BLACKBERRY® device), a personal computer, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), or a digital signal processor (DSP). The storage 114 (which can be memory such as RAM, flash memory, or disk storage) stores one or more software applications 130 (e.g., embedded applications) that, when executed by the CPU 112, perform any suitable function associated with the computing device 100. The tester 110 comprises logic that supports testing and debugging of the computing device 100 executing the software application 130. For example, the tester 110 can be used to emulate a defective or unavailable component(s) of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The CPU 112 typically comprises memory and logic which store information frequently accessed from the storage 114. Various subsystems (such as the CPU 112 and the storage 114) of the computing device 100 include scan flip-flop latches (e.g., scan latch 116), which are used during the execution the software application 130. Because of the relatively large size and the large numbers of instantiated scan flip-flop latches, a size reduction of the layout cell of a scan flip-flop with asynchronous reset can lead to significant area savings. Disclosed herein are techniques for arranging scan flip-flops (which are normally implemented as master/slave latches) having smaller layout sizes and reduced power usage during reset assertion.

The disclosed techniques are used, for example, in synchronous, clocked latches (such as flip-flops, and master slave latches) to reduce size and power requirements. For example, a clocked latch arranged in accordance with the instant disclosure can be provided as a standard design cell. The provided design cell can be used by a design engineer when designing scan-chain-tested circuitry that has a smaller design area and lower power usage. The designer can thus use the provided design cell without necessarily having to know implementation details of how the master/slave latch is cleared or laid out. When forming chains of scan flip-flops, the designer does not have to be aware of internal design implementation of the scan flip-flop cell: the designer is, instead, offered greater flexibility when coupling the output of one first scan flip-flop to an input of an adjacent (logically and/or physically) adjacent scan flip-flop.

Figure 2:
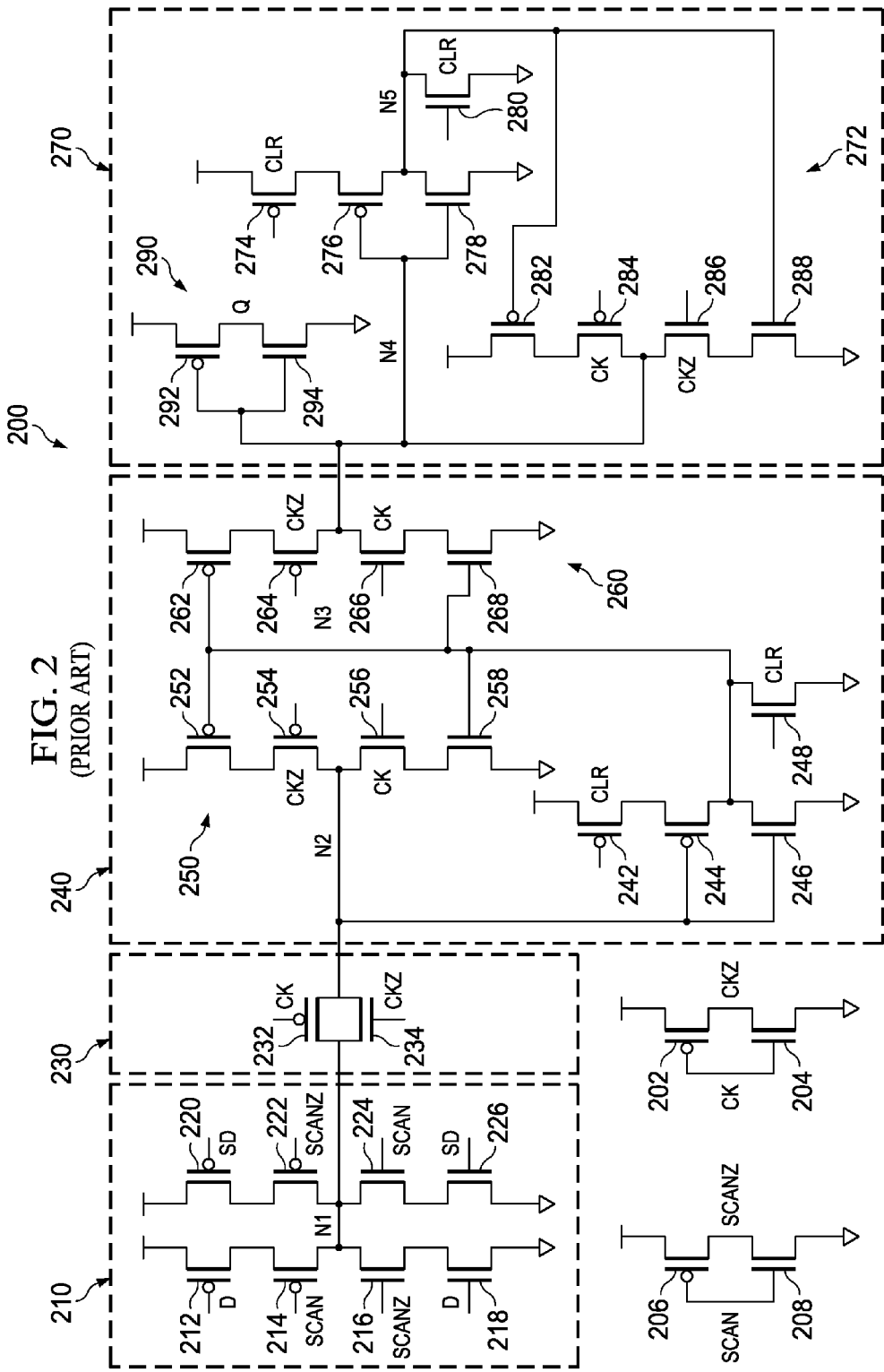
FIG. 2 is a schematic diagram illustrating a conventional scan flip-flop with active-high asynchronous reset.

FIG. 2 shows a conventional scan flip-flop 200 with active-high asynchronous reset. Scan flip-flop 200 includes input stage 210, transmission gate 230, master latch 240, and output stage 270. In operation, signals CK (clock) and CKZ (inverted clock) are used to pass either signal D (data) or SD (scan data) sequentially through the scan flip-flop 200.

The input stage 210 includes inverters formed by PMOS (positive-type metal oxide semiconductor) and NMOS (negative-type metal oxide semiconductor) pair of transistors 202 and 204, and pair of transistors 206 and 208, respectively. In operation, the PMOS transistor 202 and NMOS transistor 204 form an inverter that is used to generate a clock signal at node CKZ. (The suffix "Z" appended to a signal name normally denotes inversion of the signal logic state: for example, the signal at node CKZ is the logical complement of the signal at node CK). The PMOS transistor 206 and NMOS transistor 208 form an inverter used to generate SCANZ (inverted scan) from the input node SCAN.

The input stage 210 includes PMOS transistors 212, 214, 220, and 222, as well as NMOS transistors 216, 218, 224, and 226 that are arranged to form a multiplexor. The multiplexor is used to generate the inverse of signal SD at node N1 when SCAN is high, and the inverse of signal D at node N1 when SCAN is low.

The transmission gate 230 (e.g., a transfer gate) includes PMOS transistor 232 and NMOS transistor 234, which are coupled in parallel. In operation, transmission gate 230 passes the signal at node N1 to node N2 when CK is low, and blocks (e.g., decouples) node N1 and node N2 when node CK is high.

The master latch 240 includes three transistor stacks. The first transistor stack includes PMOS transistors 242, 244, and NMOS 246. NMOS transistor 248 and NMOS transistor 246 are coupled in parallel between node N3 and the power supply rail VSS (e.g., ground). In operation, when CLR (clear) is low, the inverter formed from PMOS transistor 244, and NMOS transistor 246 generates at node N3 the inverse of the state of node N2. When CLR is high, PMOS transistor 242 is off, thus disabling the PMOS transistor pullup network (e.g., PMOS transistor 242s and 244), and NMOS transistor 248 pulls node N3 to a static low, thus resetting master latch 240.

The second transistor stack 250 in the master latch 240 includes PMOS transistors 252 and 254 and NMOS transistors 256 and 258. In operation, when CK is high (and CKZ is low), the output of transmission gate 230 is tristated and the transistor stack 250 is used as a pass gate to drive node N2 with positive feedback from node N3, thus latching the logic state of the input signal in master latch 240. When CK is low, transistor stack 250 is tristated, which blocks the feedback path from node N3 to N2, while transmission gate 230 drives node N2 with the signal at node N1.

A third transistor stack 260 includes PMOS transistors 262 and 264 and NMOS transistors 266 and 268. In operation, when CK is high (and CKZ is low), the transistor stack 260 is used to pass the inverse of the signal at node N3 to the output of the master latch 240 (at node N4). When CK is low, the output of transistor stack 260 is tristated.

The output stage 270 and the master latch 240 are coupled together via node N4. The output stage 270 includes the slave latch 272 and the output inverter 290 at node Q (output).

In the slave latch 272, the first transistor stack includes PMOS transistors 274 and 276 and NMOS transistor 278. NMOS transistor 280 and NMOS transistor 278 are coupled in parallel between node N5 and the power supply rail VSS (e.g., ground). In operation, when CLR is low, the inverter formed from PMOS transistor 276 and NMOS transistor 278 generates the inverse of node N4 at node N5. When CLR is high, PMOS transistors 274 is off, which disables the PMOS pullup network (e.g., PMOS transistors 274 and 276), and NMOS transistor 280 pulls node N5 down to a static low. The second transistor stack includes PMOS transistors 282 and 284 and NMOS transistors 286 and 288. In operation, when CK is low, the second transistor stack in the slave latch 270 is used to drive node N4 with the inverse of node N5, which completes the feedback loop in the slave latch 272 and latches the signal in the slave latch 272. When CK is high, the output of the second transistor stack in the slave latch 270 is tristated.

The inverter 290 in the output stage 270 includes PMOS transistor 292 and NMOS transistor 294. The inverter 290 is coupled between node N4 and node Q. Thus, node Q is the output node of the master/slave latch 200.

In summary, the input signal passes through scan flip-flop 200 via inverting and non-inverting gates such that the latched logic state and the inverse of the latched logic state are held at internal nodes N1, N2, N3, N4, and N5. The latched signal is inverted at nodes N1, N2, and N4 in scan flip-flop 200. For example, if input signal D is selected (e.g., SCAN is low) when node D is high (e.g., logic "1") and scan flip-flop 200 is latched, nodes N1, N2, and N4 are low (e.g., logic "0"), and nodes N3, N5, and the output node Q are high (e.g., a logic "1").

Figure 3:
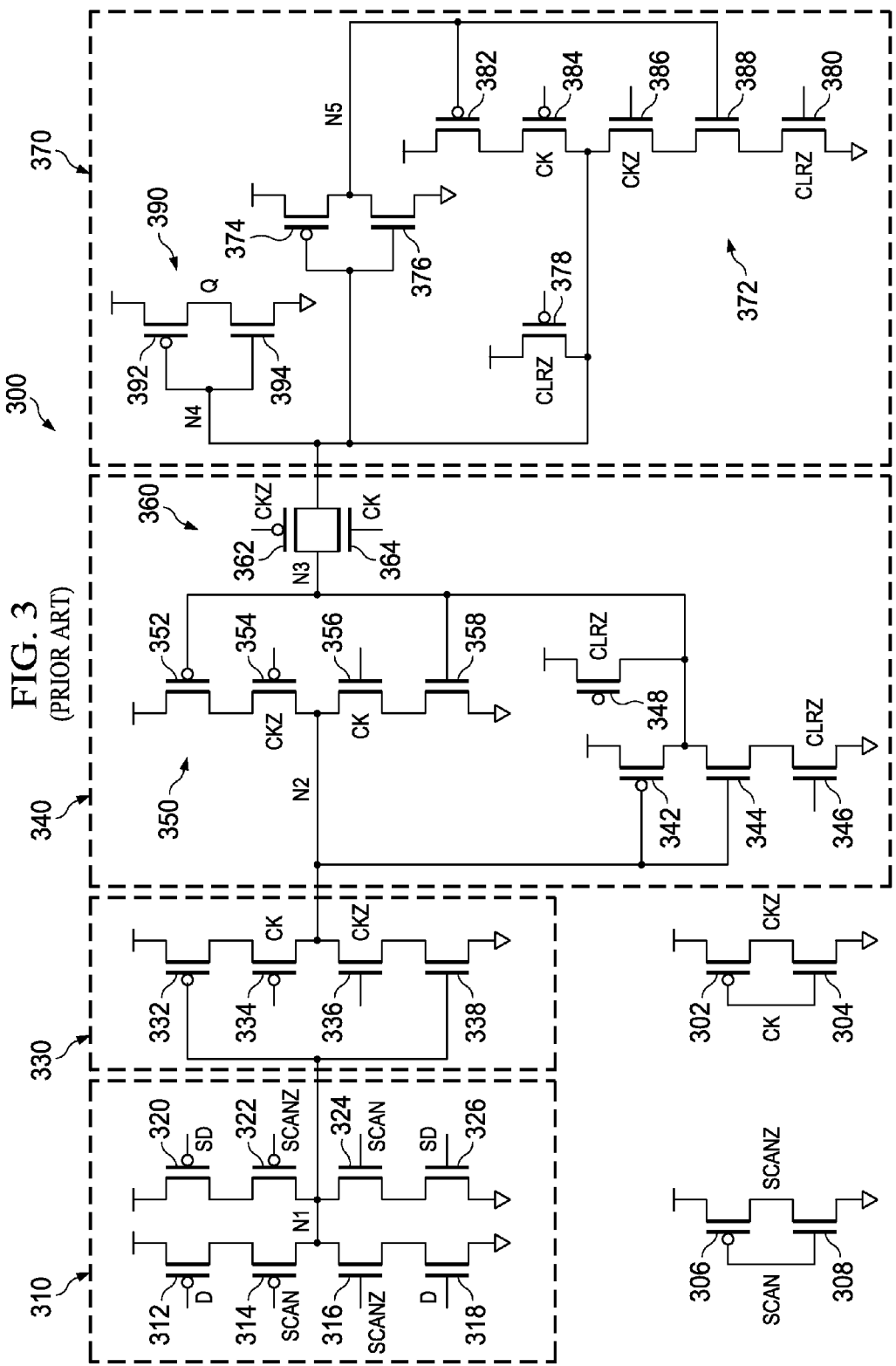
FIG. 3 is a schematic diagram illustrating another conventional scan flip-flop with active-high asynchronous reset.

FIG. 3 shows a conventional scan flip-flop 300. In comparison with scan flip-flop 200 described above, the reset signal CLRZ (inverted clear) is active low in scan flip-flop 300. Scan flip-flop 300 includes input stage 310, tristate inverter 330, master latch 340, and output stage 370. In operation, signals CK and CKZ are used to pass either signal D or SD sequentially through the scan flip-flop 300.

The input stage 310 includes inverters formed by PMOS and NMOS pair of transistors 302 and 304 and pair of transistors 306 and 308, respectively. PMOS transistor 302 and NMOS transistor 304 form an inverter that is used to generate a clock signal at node CKZ. The PMOS transistor 306 and NMOS transistor 308 form an inverter used to generate SCANZ from the input node SCAN.

The input stage 310 includes PMOS transistors 312, 314, 320, and 322 and NMOS transistors 316, 318, 324, and 326 that are arranged to form a multiplexor. The multiplexor is used to generate the inverse of signal SD at node N1 when SCAN is high, and the inverse of signal D at node N1 when SCAN is low.

In comparison with scan flip-flop 200, transistor stack 330 is coupled between input stage 310 and master latch 340 in scan flip-flop 300. The transistor stack 330 includes PMOS transistors 332 and 334 and NMOS transistors 336 and 338. In operation, the output of transistor stack 330 drives node N2 with the inverse of the signal at node N1 when CK is low, and is tristated (e.g., high impedance) when CK is high. The transistor stack 330 is coupled to the input stage 310 at node N1, and coupled to the master latch 340 at node N2. In comparison with scan flip-flop 200, when CK is low, node N2 is the inverse of the logic state at node N1.

The master latch 340 includes two transistor stacks and a transmission gate 360. The first transistor stack includes PMOS transistor 342 and NMOS transistors 344 and 346. PMOS transistors 342 and 348 are coupled in parallel between node N3 and the power supply rail VDD (e.g., supply). In operation, when the clear signal is deasserted (e.g., CLRZ is high), the inverter formed from PMOS transistor 342 and NMOS transistor 344 generates the inverse of node N2 at node N3. When CLRZ is low, NMOS transistor 346 is off, which disables the NMOS pulldown network (e.g., NMOS transistors 344 and 346), while PMOS transistor 348 pulls node N3 to a static high.

The second transistor stack 350 in the master latch 340 includes PMOS transistors 352 and 354 and NMOS transistors 356 and 358. In operation, when CK is high (and CKZ is low), the transistor stack 350 is drives node N2 with positive feedback from node N3, thus latching the signal in the master latch 340. When CK is low, transistor stack 350 is tristated, which blocks the feedback path from node N3 to node N2 such that node N2 is driven by the transistor stack 330.

In comparison with scan flip-flop 200, master latch 340 includes a transmission gate 360 formed from PMOS transistor 362 and NMOS transistor 364. In operation, when CK is high (and CKZ is low), the transmission gate 360 is used to drive node N4 with the signal at node N3. In comparison with scan flip-flop 200 described above, the transmission gate 360 is a non-inverting output driver of the master latch 340.

The output stage 370 and the master latch 340 are coupled together via node N4. The output stage 370 includes slave latch 372 and inverter 390.

In slave latch 372, the first transistor stack includes the inverter formed from PMOS transistor 374 and NMOS transistor 376. The second transistor stack includes PMOS transistors 378 and 380 and NMOS transistors 382, 384, and 386. PMOS transistor 378 is coupled in parallel with PMOS transistors 382, and 384 between node N4 and the power supply rail VDD (e.g., supply).

In comparison with slave latch 272 in scan flip-flop 200, the transistors used to clear the slave latch 372 are coupled to the transistor stack. In operation, when CLRZ is high, the transistor stack is used a feedback driver, driving node N4 with the inverse of the signal at node N5. When CLRZ is low, NMOS transistor 380 is off, disabling the NMOS pulldown network (e.g., NMOS transistors 380, 386, and 388), and PMOS transistor 378 pulls node N4 to a static high, thus latching the signal in the slave latch 372.

The output inverter 390 in the output stage 370 includes PMOS transistor 392 and NMOS transistor 394. The output inverter 390 is coupled between node N4 and to node Q. Thus, node Q is the output node of the master/slave latch 300.

In comparison with master latch 240 in scan flip-flop 200, internal nodes N3, and N5 are reset high, which simultaneously clears master latch 340 and slave latch 372 to a high state.

In comparison with scan flip-flop 200, the inverse of the latched logic signal in scan flip-flop 300 is held at nodes N1, N3, and N4. For example, if input signal SD is selected (e.g., SCAN is high) and SD is high (e.g., logic "1") while scan flip-flop 300 is latched, nodes N1, N3, and N4 are low (e.g., logic "0"), and nodes N2, N5, and Q are high (e.g., logic "1").

Figure 4:
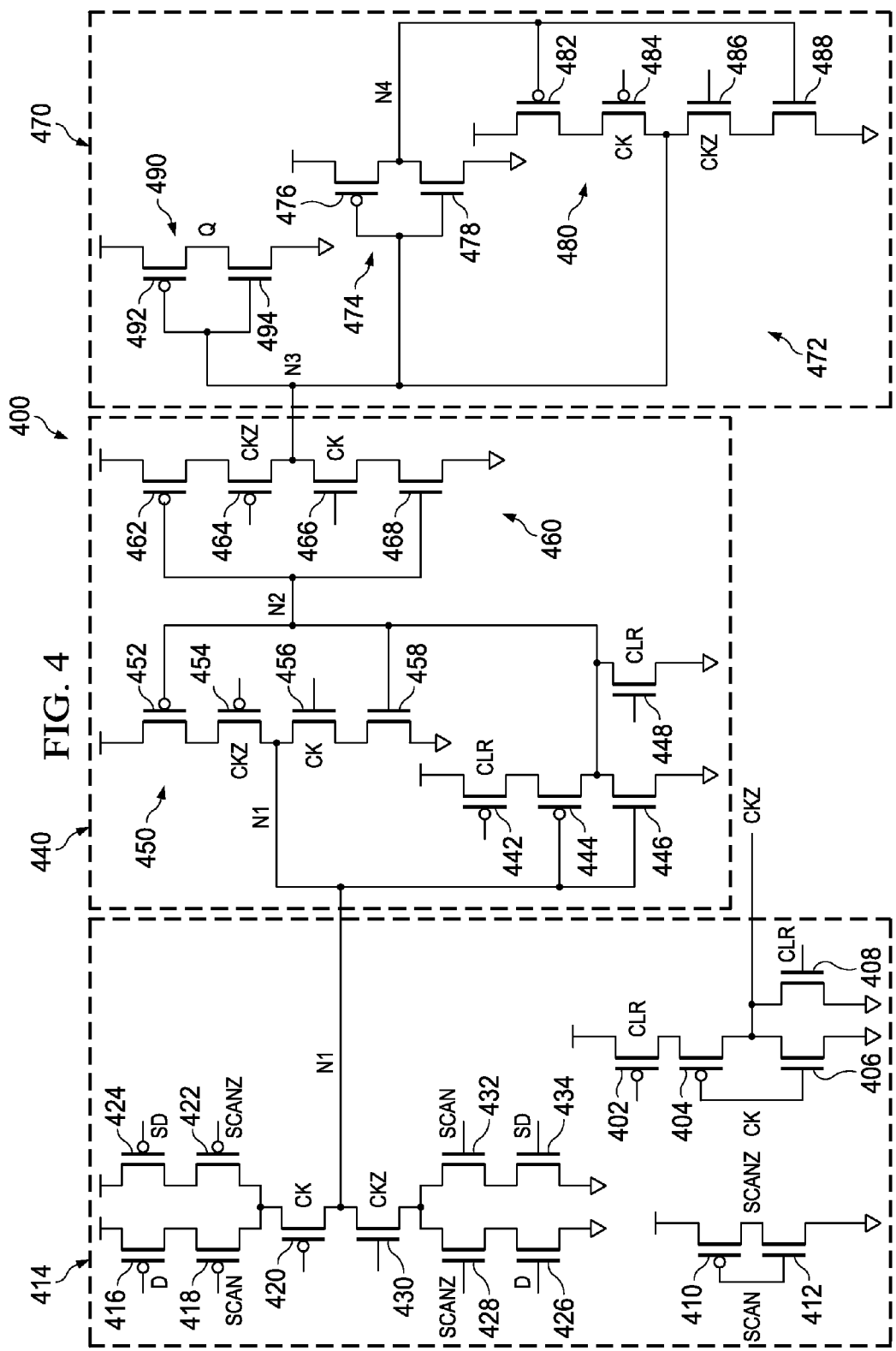
FIG. 4 is a schematic diagram illustrating a scan master/slave latch with active-high asynchronous reset in accordance with embodiments of the disclosure.

FIG. 4 is a schematic diagram illustrating a scan flip-flop 400 with active-high asynchronous reset in accordance with an embodiment of the disclosure. Scan flip-flop 400 has a reduced size, and uses less power during reset as compared with the conventional solutions. Scan flip-flop 400 includes an input stage 414, a master latch 440, and slave latch/output stage 470.

As disclosed herein, scan flip-flop 400 includes PMOS transistors 402 and 404 and NMOS transistors 406 and 408 that are arranged to form a clock generator that is used to generate a gated clock signal at node CKZ. Node CKZ is coupled to the source of NMOS transistor 408. The gate of NMOS transistor 408 is coupled to node CLR. The drain of NMOS 408 is coupled to power supply rail VSS (e.g., ground). The source of NMOS transistor 408 is coupled to the source of NMOS transistor 406. The source of NMOS transistor 408 is coupled to the source of NMOS transistor 406. The gate of NMOS transistor 406 is coupled to the clock node CK. The drain of NMOS transistor 406 is tied to the power supply rail VSS. The source of NMOS transistor 406 is further coupled to the drain of PMOS transistor 404. The gate of PMOS transistor 404 is coupled to the clock node CK. The source of PMOS transistor 404 is coupled to the drain of PMOS transistor 402. The gate of PMOS transistor 402 is coupled to node CLR. The source of PMOS transistor 402 is coupled to the power supply rail VDD (e.g., supply).

In operation, clock signal CK is gated by asynchronous active-high reset signal CLR. The gated clock signal CKZ is the inverse of the clock signal CK when CLR is not asserted (e.g., CLR is low). The gated clock signal is not active (e.g., static low) when the asynchronous clear signal is asserted (e.g., CLR is high). When node CLR is deasserted (e.g., is a low), PMOS transistor 402 is on, NMOS transistor 408 is off, PMOS transistor 404, and NMOS transistor 406 drive the inverse (e.g., logical complement) of signal CK at node CKZ. When node CLR is high, PMOS transistor 402 is off disabling the pullup stack of PMOS transistors 402 and 404, while NMOS transistor 408 is on, thus pulling node CKZ to ground (e.g., rendering CKZ inactive, or a static low state).

The asynchronous reset signal in scan flip-flop 400 clears the scan flip-flop 400, as compared to a "preset" function. For example, known scan flip-flops with preset include circuitry to be cleared to either of two selectable values (e.g., cleared to a logic state "1" or cleared to a logic state "0"). The output node Q of scan flip-flop 400 is cleared low (e.g., logic state "0") in response to the active-high asynchronous reset signal CLR being asserted (e.g., node CLR is high or logic state "1").

In input stage 414, PMOS transistors 416, 418, 420, 422, and 424 and NMOS transistors 426, 428, 430, 432 are arranged as a multiplexor that is arranged to controllably couple data input signals D and SD in response to scan enable signals SCAN and SCANZ, clock signal CK, and gated clock signal CKZ. When CLR is low (e.g., reset is inactive), the input stage 414 is arranged to alternately pass or block the logic state of the selected data input signal (e.g., either D or SD) in response to the clock signal CK and to the gated clock signal CKZ. When CK is low and SCAN is high, node N1 receives the inverse of the data input signal SD. When CK is low and SCAN is low, node N1 receives the inverse of the data input signal D. Thus, one of two data inputs is selectively coupled to the output of the input stage 414. The output of the input stage 414 is tristated (e.g., high-impedance) when CK is high and (thus) CKZ is low. As discussed above both CK and CKZ can be low at the same time when CLR is high during reset.

In input stage 414, when clear (reset) is asserted (e.g., CLR is high), CKZ is static low, which disables the NMOS pull-down network of NMOS transistors 426, 428, 430, 432, and 434. When CLR is asserted and CK is low, the PMOS pullup network of PMOS transistors 416, 418, 420, 422, and 424 is enabled, pulling N1 high when either SCAN is high and SD is high or when SCAN is low and D is high.

In comparison with scan flip-flops 200 and 300, the output of the multiplexor of the input stage 414 in scan flip-flop 400 is directly coupled to the input of the master latch 440 at node N1. Directly coupling the output of the input stage 414 lessens the internal latency of signal propagation between the input stage and the master latch 440.

The master latch 440 includes three transistor stacks. The first transistor stack includes PMOS transistors 442 and 444 and NMOS transistor 446. NMOS transistor 448 and NMOS transistor 446 are coupled in parallel between node N2 and the power supply rail VSS (e.g., ground). The second transistor stack 450 in the master latch 440 includes PMOS transistors 452 and 454 and NMOS transistors 456 and 458. In operation, when the asynchronous clear signal CLR is low, the first transistor stack is used as an inverter, and the second stack 450 is used to synchronously pass (and invert) the state of node N1 to node N2. When CLR is low, CK is low, and CKZ is high, the output (at node N1) of the second transistor stack 450 is tristated, and the master latch 440 receives the signal at node N1 that is driven by the input stage 414. Node N2 is driven to the inverse of node N1 by the inverter formed from PMOS transistor 444 and NMOS transistor 446. When CK goes high and CKZ goes low, the master latch 440 latches the signal at node N1. Accordingly, the input stage no longer drives node N1, and transistor stack 450, operates as an inverter to drive node N1 in accordance with the positive feedback from node N2. Thus, the latched state is maintained at node N1 in response to the internal feedback path that includes node N1, the inverter formed from PMOS transistor 444 and NMOS transistor 446, node N2, and transistor stack 450.

When CLR is high (and CKZ is low), PMOS transistor 442 is off, which disables the PMOS pullup network (e.g., PMOS transistors 442 and 444), while NMOS transistor 448 pulls node N2 to a static low. PMOS transistor 452 is on in response to node N2 being low, and PMOS transistor 454 is on in response to CKZ being low, which drives node N1 high. Also, NMOS transistor 458 is off (in response to node N2 being pulled low), which disables the pulldown network of NMOS transistors 456 and 45, which prevents node N1 from going low.

A third transistor stack 460 in the master latch 440 includes PMOS transistors 462, 464, and NMOS transistors 466 and 468. The gate of PMOS transistor 464 is coupled to the gated clock signal CKZ, while the source of PMOS transistor 464 is coupled to the power supply voltage VDD via PMOS transistor 462. The gate of NMOS transistor 466 is coupled to the clock signal CK, and the drain of NMOS transistor 466 is coupled to the power supply voltage VSS via NMOS transistor 468. When the clear signal is deasserted (e.g., CLR is low) the third transistor stack is arranged as a pass gate to drive node N3 with the inverse of node N2. When CLR is low and CK is high (and CKZ is low), the third transistor stack 460 drives node N3 with the inverse of the latched state at node N2. When CLR is low and CK is low (and CKZ is high), the output of the transistor stack 460 is tristated.

When the clear signal is asserted (e.g., CLR is high and CKZ is static low) PMOS transistor 464 stays on. Node N2 is maintained low by NMOS transistor 448, which causes PMOS transistor 462 to stay on, thus enabling the pullup network of PMOS transistors 462 and 464 to drive node N3 high. NMOS transistor 466 continues to toggle (e.g., turn on and off) in response to the clock signal CK, however NMOS transistor 468 is maintained off in response to node N2 being low, which disables the pulldown network of NMOS transistors 466 and 468. Node N3 is thus driven high in response to the low signal generated at node N2 in response to the clear signal CLR being high. Accordingly, when CK is high (and CKZ is low), the transistor stack 460 is used selectively to drive node N3 with the inverse of the signal at node N2. When CK is low, the output of transistor stack 460 is tristated.

The input of the slave latch/output stage 470 receives the output of the master latch 440 via node N3. The slave latch/output stage 470 includes a slave latch 472 and an inverter 490.

The slave latch 472 includes an inverter 474 and a transistor stack 480 in a feedback path. Inverter 474 is includes PMOS transistor 476 and NMOS transistor 478. The transistor stack 480 in the slave latch 472 includes PMOS transistors 482 and 484 and NMOS transistors 486 and 488 arranged in series. The gates of the PMOS transistor 482 and NMOS transistor 488 are coupled to (and controlled by) the output of the inverter 474. In comparison with scan flip-flops 200, and 300, the slave latch 472 does not include a transistor that is coupled to the internal node N4 and responds to the asynchronous clear signal CLR or an inversion of the asynchronous clear signal CLR. None of the gates of the transistors in slave latch 472 are directly coupled to the asynchronous clear signal CLR.

In operation, when CK is high (and CKZ is low), the output of the transistor stack 480 is tristated, and the slave latch 472 receives the signal at node N3 driven by the transistor stack 460 in the master latch 440. Node N4 is driven to the inverse of node N3 by the inverter 474 in the feedback path of the slave latch 472. When CK is low, the slave latch 472 latches the signal at internal node N4. The transistor stack 460 in master latch 440 no longer drives node N3 (see transistors 464 and 466), and transistor stack 480 selectively drives node N3 with positive feedback from node N4. The latched state is maintained at node N4 in response to the internal feedback path in the slave latch 472. The internal feedback path of the slave latch 472 includes node N3, the inverter 474, node N4, and transistor stack 480.

In comparison with the slave latch 270 in scan flip-flop 200 and the slave latch 370 in scan flip-flop 300, the slave latch 472 asynchronously passes (e.g., propagates) the cleared latched state (at node N3) from the master latch 440 that was latched in the master latch 440 in a first clock state of the clock signal (e.g., when signal CK is high) is latched in the slave latch 472 in a second sequential state of the clock signal (e.g., when signal CK is low). When node CLR is high, node CKZ is static low, node N3 in the slave latch 472 is high, and slave latch internal node N4 is thus driven low. When node CKZ is low, NMOS transistor 486 is turned off, which disables NMOS transistor 488. Also, PMOS transistor 484 is on, which enables PMOS transistor 482. When node CK is low and node CKZ is high, PMOS transistor 482 drives node N3 to a high (in parallel with the PMOS transistor 464), setting node N3 to a static high cleared state.

The output inverter 490 in the slave latch/output stage 470 includes PMOS transistor 492 and NMOS transistor 494. The output inverter 490 is coupled between node N4 and node Q. Node Q is an output node of the scan flip-flop 400.

In comparison with scan flip-flops 200, and 300, scan flip-flop 400 has only four basic internal nodes: N1, N2, N3, and N4, which reduces latency. In comparison with scan flip-flops 200, and 300, the inverse of the latched logic signal in scan flip-flop 300 is held at nodes N1, and N3. For example, if input signal SD is selected (e.g., SCAN is high), SD is high (e.g., logic "1"), and scan flip-flop 300 is latched, nodes N1, and N3, are low (e.g., logic "0"), and nodes N2, N5, and Q are high (e.g., logic "1"). Alternating the "sense" (e.g., positive logic vis-à-vis negative logic) of the logic every-other node also reduces latency of the scan flip-flop due to the inverting nature of the physical implementation of the logic gates.

In reset, CKZ is static low and the gates coupled to CKZ are not toggling. The capacitance associated with toggling is not being charged and discharged (and switch current is not being expended). Thus, scan flip-flop 400, consumes less power during reset (and/or being held in a reset state).

The layout of the latch portion of conventional flip-flops is typically congested, and the routing for the clear logic (as disclosed herein) aggravates the problem. In accordance with the present disclosure, scan flip-flop 400 does not have clearing logic in the slave latch 472, which eliminates an important source of congestion. Rather, the clearing logic is arranged in the clock generator in the input stage 414, which frees space in the slave latch 472, which frees area for routing data, power, and control signals. The layout of scan flip-flop 400 is thus smaller, consuming less silicon area on a chip than conventional solutions.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A master/slave latch, comprising:
 an input stage that is arranged to alternately pass or block a data input signal in response to a clock signal and a gated clock signal that is gated by an asynchronous clear signal such that the gated clock signal is the inverse of the clock signal when the asynchronous clear signal is not asserted and the gated clock signal is not active when the asynchronous clear signal is asserted;
 a master latch coupled to receive and to latch the passed data signal in a latched state, arranged to maintain the latched state at a node of the master latch in response to a feedback path internal to the master latch and to clear the latched state in response to the asynchronous clear signal being asserted, and is arranged to generate a master latch output signal at a pass gate in response to the latched state of the master latch; and
 a slave latch coupled to receive and to latch the master latch output signal in a latched state and wherein the pass gate is arranged to pass a cleared latched state to the slave latch in response to the asynchronous clear signal being asserted.

2. The latch of claim 1, wherein the pass gate includes a first transistor having an input that is controllably coupled to a first power supply rail in response to the gated clock signal, and includes a second transistor having an input that is controllably coupled to a first power supply rail in response to the clock signal.

3. The latch of claim 1, wherein the input stage is arranged to alternately pass or block a data input signal in response to a scan signal.

4. The latch of claim 1, wherein the slave latch is arranged to maintain the latched state at a node of the slave latch in response to a feedback path internal to the slave latch.

5. The latch of claim 4, wherein the slave latch does not include a transistor that is arranged to drive the node of the slave latch in response to the asynchronous clear signal or an inversion of the asynchronous clear signal.

6. The latch of claim 1, wherein the gated clock signal is generated at the source of a first NMOS (negative-type metal-oxide semiconductor) transistor having a gate that is controlled by the asynchronous clear signal and having a drain that is coupled to a first power supply rail, wherein the source of the first NMOS transistor is coupled to a source of a second NMOS transistor having a gate that is controlled by the clock signal and having a drain that is coupled to a first power supply rail, wherein the source of the first NMOS transistor is coupled to a drain of a first PMOS (positive-type metal-oxide semiconductor) transistor having a gate that is controlled by the clock signal and having a source that is coupled to the drain of a second PMOS transistor, wherein the second PMOS transistor includes a gate that is controlled by the asynchronous clear signal and includes a source that is coupled to the second power supply rail.

7. The latch of claim 1, wherein the feedback loop of the slave latch includes a first transistor of a first type arranged in series with a second transistor of the first type, wherein the second transistor of the first type is arranged in series with a first transistor of an opposite type, wherein the first transistor of the opposite type is arranged in series with a second transistor of the opposite type, wherein the gates of the first transistor of the first type and the second transistor of the opposite type are controlled by an output of an inverter that forms part of the feedback path, wherein the gate of the second transistor of the first type is controlled by the clock signal, and wherein the gate of the first transistor of the opposite type is controlled by the gated clock signal.

8. The latch of claim 1, wherein the gated clock signal is generated by inverting the clock signal when the clear signal is not asserted, and producing a static level when the clear signal is asserted.

9. The latch of claim 8, wherein the static level is low.

10. The latch of claim 1, wherein the gated clock signal is the inverse of the clock signal when the asynchronous clear signal is not asserted, and a static level when the clear signal is asserted.

11. The latch of claim 1, wherein the cleared latched state latched in the master latch in a first clock state of the clock signal is latched in the slave latch in a second state of the clock signal.

12. An electronic system having a self-test capability, comprising:
operational circuitry arranged on a substrate for performing a software application;
a clock generator for generating a clock signal to synchronize the operational circuitry; and
a plurality of scan flip-flops that are arranged in the substrate to provide test stimulus to and read test results from the operational circuitry, wherein each scan flip-flop includes an output that is coupled to an input of an adjacent scan flip-flop, and wherein each scan flip-flop includes:
an input stage that is arranged to alternately pass or block a data input signal in response to the clock signal and a gated clock signal that is gated by an asynchronous clear signal such that the gated clock signal is the inverse of the clock signal when the asynchronous clear signal is not asserted and the gated clock signal is not active when the asynchronous clear signal is asserted;
a master latch coupled to receive and to latch the passed data signal in a latched state, arranged to maintain the latched state at a node of the master latch in response to a feedback path internal to the master latch and to clear the latched state in response to the asynchronous clear signal being asserted, and is arranged to generate a master latch output signal in response to the latched state of the master latch; and
a slave latch coupled to receive and to latch the master latch output signal in a latched state and wherein the slave latch is arranged to asynchronously receive the cleared latched state in response to the asynchronous clear signal being asserted.

13. The system of claim 12, wherein the slave latch is arranged to latch the cleared latched state in response to the asynchronous clear signal being asserted.

14. The system of claim 12, wherein each scan flip-flop is arranged to conserve power in a reset state by gating the clock signal applied to either a pullup or pulldown network of transistors.

15. The system of claim 12, wherein the assertion of the asynchronous clear signal in the master latch sets the state of the master latch to a predetermined state.

16. The system of claim 15, wherein the assertion of the asynchronous clear signal in the master latch changes the output state of an output driver of the master latch from a tristated state to a driving state for conveying the predetermined state to the slave latch.

17. A method of latching in a master/slave flip-flop, comprising:
generating a gated clock signal that is gated by an asynchronous clear signal such that the gated clock signal is the inverse of a clock signal when the asynchronous clear signal is not asserted and the gated clock signal is not active when the asynchronous clear signal is asserted;
applying the gated clock signal to a first transistor network of a first type in a feedback loop in a master latch of the master/slave flip-flop and to a second transistor network of a second type in a feedback loop in a slave latch of the master/slave flip-flop;
applying the gated clock signal to a first transistor network of a second type in the feedback loop in the master latch of the master/slave flip-flop and to a second transistor network of the second type in the feedback loop in the slave latch of the master/slave flip-flop; and
asynchronously clearing the latched state of the master latch in response to the asynchronous clear signal being asserted and using the cleared latched state of the master latch to asynchronously set the state of the slave latch.

18. The method of claim 17, comprising selecting between a first and a second data input for driving the state of the feedback loop in the master latch of the master/slave flip-flop.

19. The method of claim 17, wherein the asynchronous clear signal is not connected to the slave latch portion of the scan flip-flop.

20. The method of claim 17, wherein the assertion of the asynchronous clear signal in the master latch changes the output state of an output driver of the master latch from a tristated state to a driving state for conveying the cleared latched state of the master latch to the slave latch.

* * * * *